(12) United States Patent
Chen et al.

(10) Patent No.: US 9,383,038 B2
(45) Date of Patent: Jul. 5, 2016

(54) CABLE MANAGEMENT ARM SUPPORTING DEVICE AND MOUNTING ASSEMBLY THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 43 days.

(21) Appl. No.: 14/560,214

(22) Filed: Dec. 4, 2014

(65) Prior Publication Data

US 2016/0161026 A1    Jun. 9, 2016

(51) Int. Cl.
*F16L 3/015* (2006.01)
*F16L 3/26* (2006.01)

(52) U.S. Cl.
CPC .. *F16L 3/015* (2013.01); *F16L 3/26* (2013.01)

(58) Field of Classification Search
CPC ......... F16L 13/015; F16L 3/26; H05K 7/1491
USPC ............... 248/70; 211/26, 175, 189; 312/223
See application file for complete search history.

(56) References Cited

U.S. PATENT DOCUMENTS

| 7,472,795 | B2 | 1/2009 | Dubon et al. |
| 7,554,819 | B2 | 6/2009 | Chen et al. |
| 7,654,398 | B2 | 2/2010 | Bridges et al. |
| 7,712,615 | B2 | 5/2010 | Chen et al. |
| 7,746,667 | B1 | 6/2010 | Baiza et al. |
| 8,231,014 | B2 | 7/2012 | Chen et al. |
| 8,251,321 | B2 | 8/2012 | Chen et al. |
| 8,634,198 | B2 * | 1/2014 | Chen ................ H05K 7/1491 174/68.3 |
| 8,833,715 | B2 * | 9/2014 | Chen ................ H05K 7/1491 211/26 |
| 9,072,190 | B2 * | 6/2015 | Chen ................ H05K 7/1421 |
| 9,072,194 | B2 * | 6/2015 | Chen ................ H05K 7/1491 |
| 9,144,174 | B2 * | 9/2015 | Chen ................ H05K 7/1491 |
| 9,281,676 | B2 * | 3/2016 | Chen ................ H05K 7/1491 |
| 2006/0081736 | A1 * | 4/2006 | Chen ................ F16L 3/01 248/68.1 |
| 2006/0113433 | A1 * | 6/2006 | Chen ................ H05K 7/1491 248/70 |
| 2007/0017883 | A1 * | 1/2007 | Bridges ............ H05K 7/1491 211/26 |
| 2007/0227756 | A1 * | 10/2007 | Doerr ............... H05K 7/1491 174/69 |
| 2009/0078834 | A1 * | 3/2009 | Chen ................ H01R 9/2416 248/70 |

(Continued)

*Primary Examiner* — Joshua J Michener
*Assistant Examiner* — Alp Akbasli
(74) *Attorney, Agent, or Firm* — Rosenberg, Klein & Lee

(57) ABSTRACT

A cable management arm supporting device is provided to be mounted between first and second slide rail assemblies. The first slide rail assembly includes first and second rails and a third rail movably connected therebetween. The cable management arm supporting device includes: two movably connected arms; first and second mounting members respectively connected with end portions of the arms and respectively mounted to the first and second rails; a supporting base including two supporting portions; two telescopically connected supporting members respectively connected with one supporting portion of the supporting base and the third rail; and a third mounting member movably connected with the other supporting portion of the supporting base and releasably connected with the second slide rail assembly.

11 Claims, 14 Drawing Sheets

(56) References Cited

U.S. PATENT DOCUMENTS

2010/0193646 A1* 8/2010 Chen .................... H02G 3/0456
248/70

2013/0233980 A1* 9/2013 Chen .................... H05K 7/1491
248/70

* cited by examiner

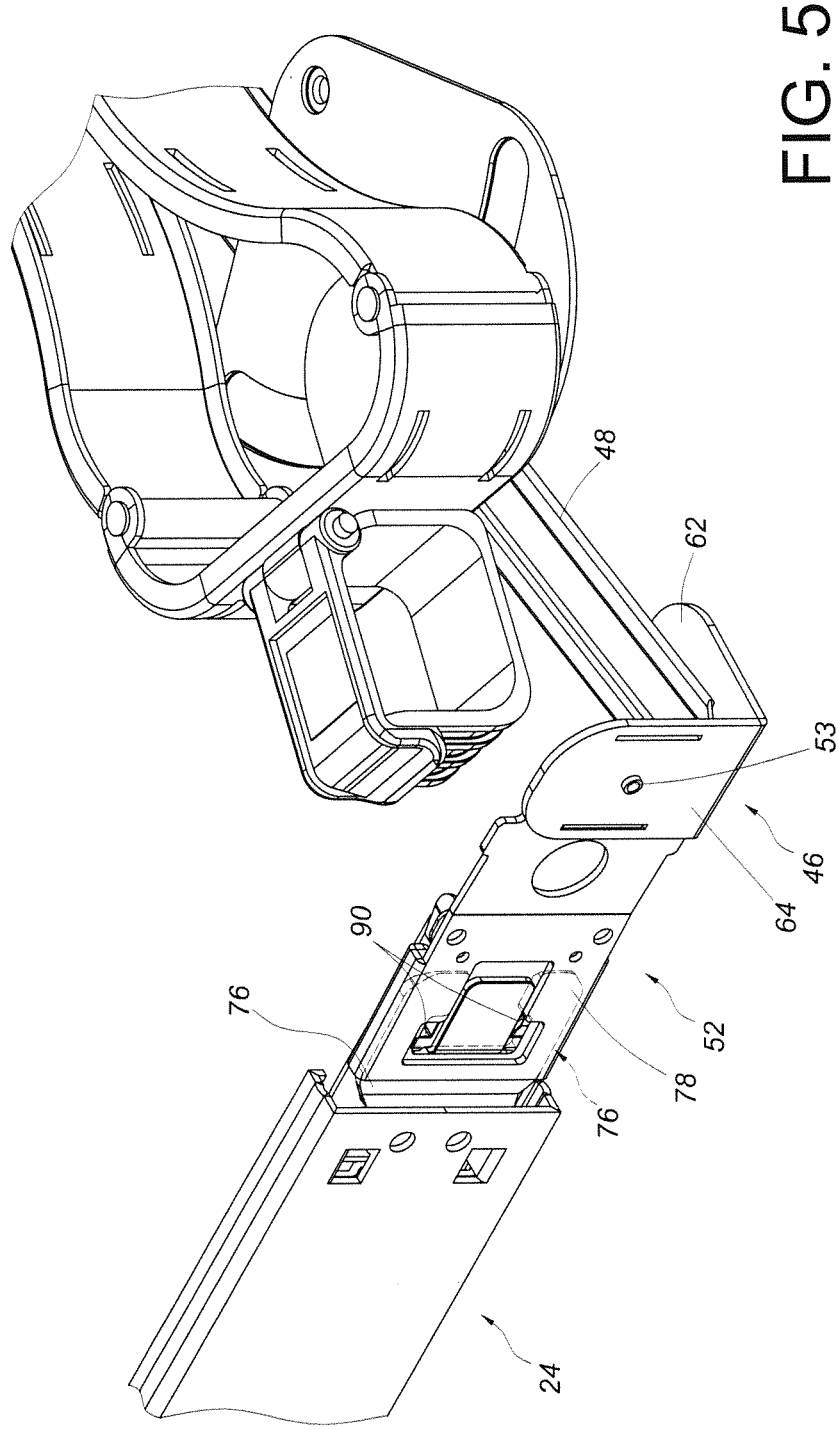

CABLE MANAGEMENT ARM SUPPORTING DEVICE AND MOUNTING ASSEMBLY THEREOF

FIELD OF THE INVENTION

The present invention relates to a cable management arm (CMA) and, more particularly, to a cable management arm supporting device whose supporting members can be rapidly assembled to applicable slide rail assemblies and be easily and rapidly detached from the slide rail assemblies when desired.

BACKGROUND OF THE INVENTION

U.S. Pat. No. 7,746,667 B1 discloses a telescoping support crossbar for a cable management arm. According to the specification and drawings of this patent, a cable management arm (CMA) (24) includes two pivotally connected support sections (26, 28) which are respectively connected to a chassis member (22) and to a cabinet member (18) of a drawer slide. A telescoping support crossbar (42), on the other hand, includes a first member (46) and a second member (48) slidably extensible from the first member (46). FIGS. 3~5 of the patent also show that the telescoping support crossbar (42) has two ends (50, 52) which are respectively mounted to an end of an intermediate member (20) of a drawer slide and to the cabinet member (18) of another drawer slide via a pivot fastener (60).

While the patent cited above discloses the technical feature of mounting the telescoping support crossbar (42) to drawer slides, it is highly desirable to develop a different cable management arm supporting device which realizes the concept of product simplification and takes into account the ease of mounting so as to meet the changeable needs of related industries.

SUMMARY OF THE INVENTION

The present invention relates to a cable management arm supporting device whose supporting members can be rapidly assembled to and easily and rapidly detached from applicable slide rail assemblies.

According to one aspect of the present invention, a cable management arm supporting device is provided to be mounted to a first slide rail assembly and a second slide rail assembly. The first slide rail assembly includes a first rail, a second rail, and a third rail movably connected between the first rail and the second rail. The cable management aim supporting device includes a first arm, a first mounting member, a second arm, a second mounting member, a plurality of cable supporting features, a supporting base, a first supporting member, a second supporting member, and a third mounting member. The first arm has a first end and a second end. The first mounting member is connected to the first arm at a position adjacent to the first end of the first arm. In addition, the first mounting member is mounted to the first rail of the first slide rail assembly. The second arm is movably connected to the first arm at a position adjacent to the second end of the first arm. The second mounting member is connected with the second arm and is mounted to the second rail of the first slide rail assembly. The cable supporting features are connected with at least one of the first arm and the second arm. The supporting base has a first supporting portion and a second supporting portion generally perpendicularly connected with the first supporting portion. The first supporting member is movably connected with the first supporting portion of the supporting base. The second supporting member is telescopically connected with the first supporting member and is mounted to the third rail of the first slide rail assembly. The third mounting member is pivotally connected with the second supporting portion of the supporting base and is releasably connected with the second slide rail assembly.

Preferably, the first slide rail assembly further includes a first connector connected with the first rail, and the first mounting member is releasably mounted to the first connector.

Preferably, the first slide rail assembly further includes a second connector connected with the second rail, and the second mounting member is releasably mounted to the second connector.

Preferably, the second slide rail assembly further includes a connector, and the third mounting member further includes a mounting wall and an operation arm connected with the mounting wall. The mounting wall includes at least one fixing portion and a first opening. The operation arm includes a connecting portion connected with the at least one fixing portion and further includes a first elastic portion. The first elastic portion is connected with one side of the connecting portion, corresponds to the first opening, and includes at least one engaging portion for blocking the connector.

Preferably, the mounting wall of the third mounting member further includes a second opening, the operation arm further includes a second elastic portion connected with another side of the connecting portion and corresponding to the second opening and also includes an engaging section connected with the second elastic portion, and the second supporting portion of the supporting base further includes a first positioning portion and a second positioning portion. The engaging section can be selectively engaged with either of the first positioning portion and the second positioning portion.

Preferably, the cable management arm supporting device further includes an elastic element connected between the third mounting member and the second supporting portion of the supporting base, and the second supporting portion of the supporting base further includes a first stop portion and a second stop portion. When pivoted to a first direction, the third mounting member is pressed against the first stop portion due to the elastic element; when pivoted to a second direction opposite the first direction, the third mounting member is pressed against the second stop portion due to the elastic element.

Preferably, the first slide rail assembly further includes an auxiliary element connected with the third rail of the first slide rail assembly and a positioning element connected with the second supporting member. The auxiliary element includes a mounting opening and an elastic arm. The elastic arm has a blocking edge for forming a blockage at the mounting opening. The positioning element is mounted in the mounting opening and can be blocked by the blocking edge of the elastic arm.

Preferably, the cable management arm supporting device further includes a hinge member, and the first arm and the second arm are pivotally connected by the hinge member.

Preferably, the first mounting member is pivotally connected with the first end of the first arm.

Preferably, the second mounting member is pivotally connected with the second arm.

Preferably, the first supporting member is pivotally connected with the first supporting portion of the supporting base.

According to another aspect of the present invention, a mounting assembly applicable to a supporting member includes a supporting base and a mounting member. The supporting base has a first supporting portion and a second supporting portion generally perpendicularly connected with the first supporting portion. The supporting member is movably connected with the first supporting portion. The mounting member is pivotally connected with the second supporting portion of the supporting base.

Preferably, the mounting member further includes a mounting wall and an operation arm connected with the mounting wall. The mounting wall includes at least one fixing portion and a first opening. The operation arm includes a connecting portion connected with the at least one fixing portion and further includes a first elastic portion. The first elastic portion is connected with one side of the connecting portion, corresponds to the first opening, and includes at least one engaging portion for blocking an object.

Preferably, the mounting wall of the mounting member further includes a second opening, the operation arm further includes a second elastic portion connected with another side of the connecting portion and corresponding to the second opening and also includes an engaging section connected with the second elastic portion, and the second supporting portion of the supporting base further includes a first positioning portion and a second positioning portion. The engaging section can be selectively engaged with either of the first positioning portion and the second positioning portion.

Preferably, the mounting assembly further includes an elastic element connected between the mounting member and the second supporting portion of the supporting base, and the second supporting portion of the supporting base further includes a first stop portion and a second stop portion. The mounting member is pressed against the first stop portion due to the elastic element when pivoted to a first direction and is pressed against the second stop portion due to the elastic element when pivoted to a second direction opposite the first direction.

One advantageous feature of implementing the present invention is that the supporting members can be rapidly assembled to applicable slide rail assemblies and be easily and rapidly detached from the slide rail assemblies when desired.

BRIEF DESCRIPTION OF THE DRAWINGS

The invention as well as a preferred mode of use and the advantages thereof will be best understood by referring to the following detailed description of some illustrative embodiments in conjunction with the accompanying drawings, in which:

FIG. 5 is a schematic perspective view showing how the third mounting member of the cable management arm supporting device in an embodiment of the present invention is pivotally connected with the second supporting portion of the supporting base and mounted to a connector of the second slide rail assembly;

DETAILED DESCRIPTION OF THE INVENTION

Figure 1:
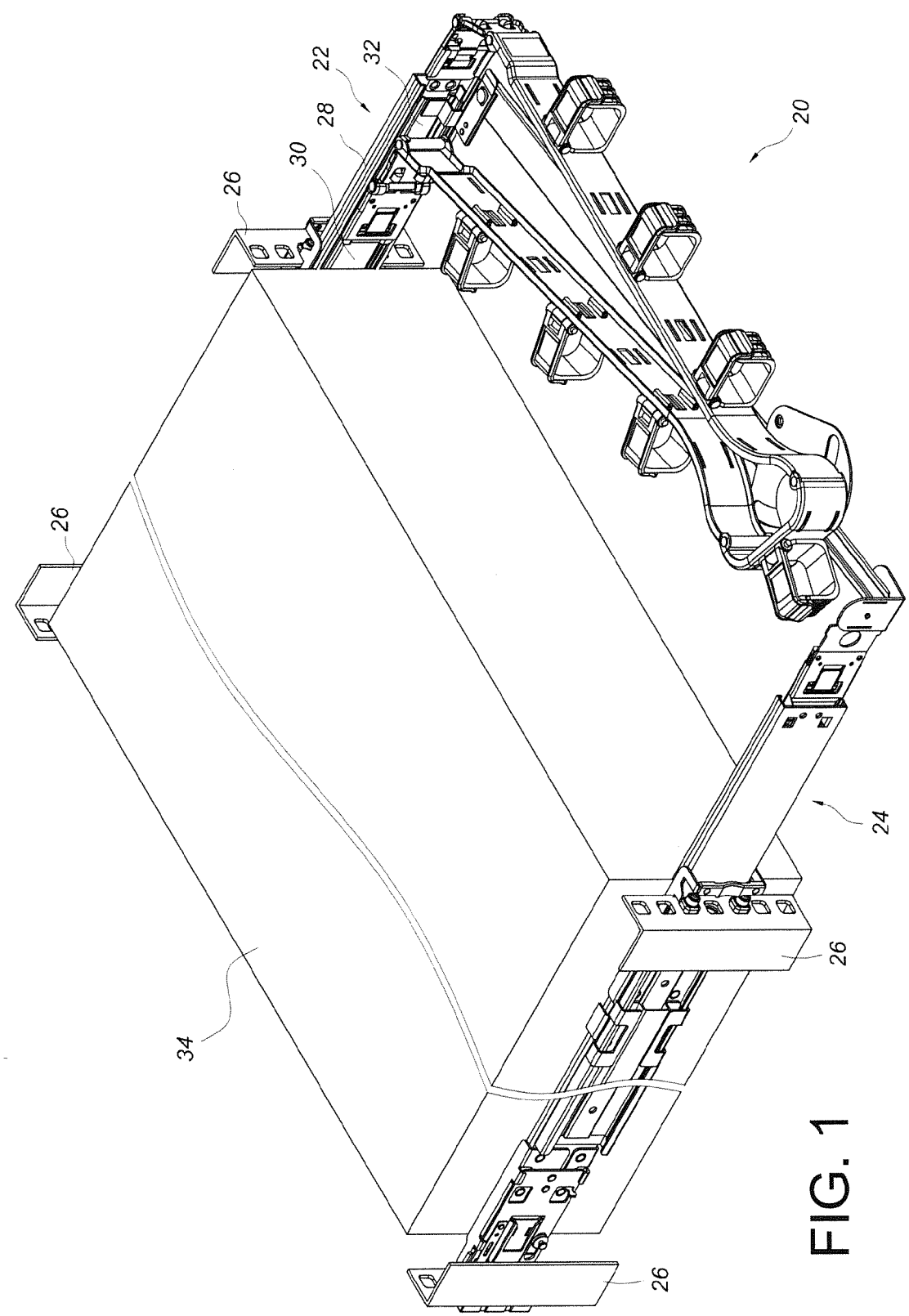
FIG. 1 is a schematic perspective view in which the cable management arm supporting device according to an embodiment of the present invention is mounted to a first slide rail assembly and a second slide rail assembly.
Figure 2:
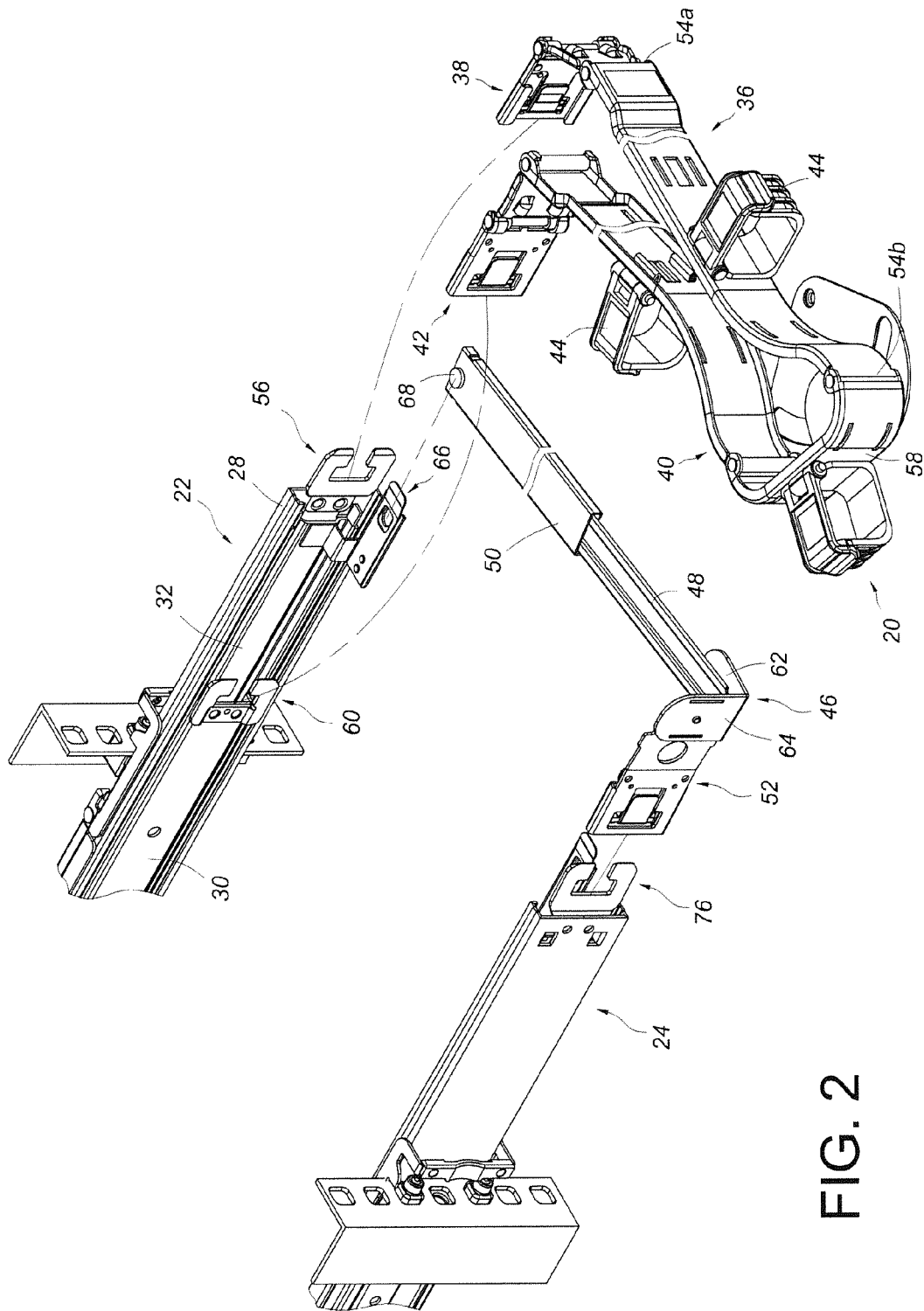
FIG. 2 is a schematic exploded view in which the cable management arm supporting device of FIG. 1 is separated from the first slide rail assembly and the second slide rail assembly.

Referring to FIG. 1 and FIG. 2, the cable management arm supporting device 20 in an embodiment of the present invention is mounted to a first slide rail assembly 22 and a second slide rail assembly 24. Each of the slide rail assemblies 22 and 24 is mounted to a corresponding pair of posts 26.

Each of the slide rail assemblies 22 and 24 includes a first rail 28, a second rail 30, and a third rail 32 movably connected between the first rail 28 and the second rail 30 so as to increase the distance by which the second rail 30 can be longitudinally displaced relative to the first rail 28. The chassis 34 of a server can have its two opposite lateral sides mounted to the second rail 30 of the first slide rail assembly 22 and the second rail of the second slide rail assembly 24 respectively in order for the two slide rail assemblies 22 and 24 to support the chassis 34. (The second rail and the third rail of the second slide rail assembly 24 are not shown in the drawings due to limitations of the viewing angle.)

The cable management arm supporting device 20 includes a first arm 36, a first mounting member 38, a second arm 40, a second mounting member 42, a plurality of cable supporting features 44, a supporting base 46, a first supporting member 48, a second supporting member 50, and a third mounting member 52.

The first arm 36 has a first end 54a and a second end 54b. The first mounting member 38 is connected to the first arm 36 at a position adjacent to the first end 54a. For example, the first mounting member 38 is pivotally connected to the first arm 36 at a position adjacent to the first end 54a. In use, the first mounting member 38 is mounted to the first rail 28 of the first slide rail assembly 22. Preferably, the first slide rail assembly 22 includes a first connector 56 connected with the first rail 28 of the first slide rail assembly 22 (e.g., the first connector 56 being connected to the first rail 28 at a position adjacent to an end portion thereof), and the first mounting member 38 is mounted to the first connector 56. For example, the first mounting member 38 is releasably mounted to the first connector 56.

The second arm 40 is movably connected to the first arm 36 at a position adjacent to the second end 54b. In a preferred embodiment, the second arm 40 is pivotally connected with the first arm 36 via a hinge member 58 (or a hinge structure) in order to be extended (see FIG. 11) or retracted relative to the first arm 36.

The second mounting member 42 is connected with the second arm 40. For example, the second mounting member 42 is pivotally connected to the second arm 40 at a position adjacent to an end portion thereof. In use, the second mounting member 42 is mounted to the second rail 30 of the first slide rail assembly 22. Preferably, the first slide rail assembly 22 includes a second connector 60 connected with the second rail 30 of the first slide rail assembly 22 (e.g., the second connector 60 being connected to the second rail 30 at a position adjacent to an end portion thereof), and the second mounting member 42 is mounted to the second connector 60. For example, the second mounting member 42 is releasably mounted to the second connector 60.

The cable supporting features 44 are connected with one of the first arm 36 and the second arm 40. In a preferred embodiment, the cable supporting features 44 are connected with both the first arm 36 and the second arm 40. The cable supporting features 44 serve to hold the cables (not shown) of a server.

The supporting base 46 has a first supporting portion 62 and a second supporting portion 64 generally perpendicularly connected with the first supporting portion 62.

The first supporting member 48 is movably connected with the first supporting portion 62 of the supporting base 46. The second supporting member 50 is telescopically connected with the first supporting member 48. The first supporting member 48 and the second supporting member 50 are below one of the first arm 36 and the second arm 40 in order to serve supporting purposes, preventing the first arm 36 and the second arm 40 from falling because of the weight of the cables they carry.

Figure 3:
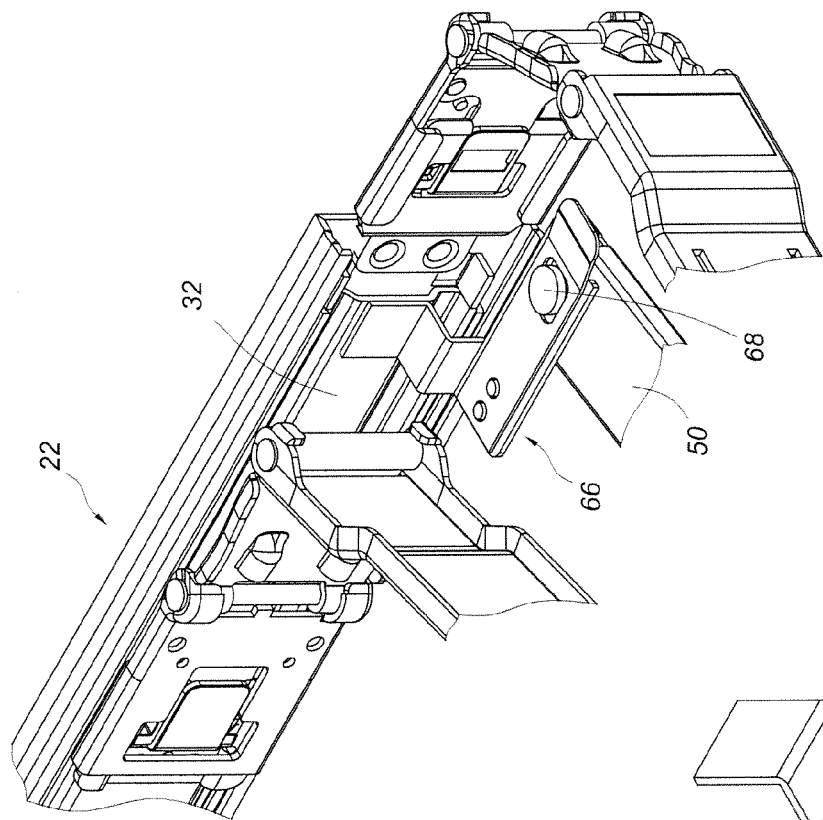
FIG. 3 is a schematic perspective view in which the first mounting member, the second mounting member, and the second supporting member of the cable management arm supporting device in an embodiment of the present invention are mounted to the first rail, the second rail, and the third rail of the first slide rail assembly respectively.
Figure 3A:
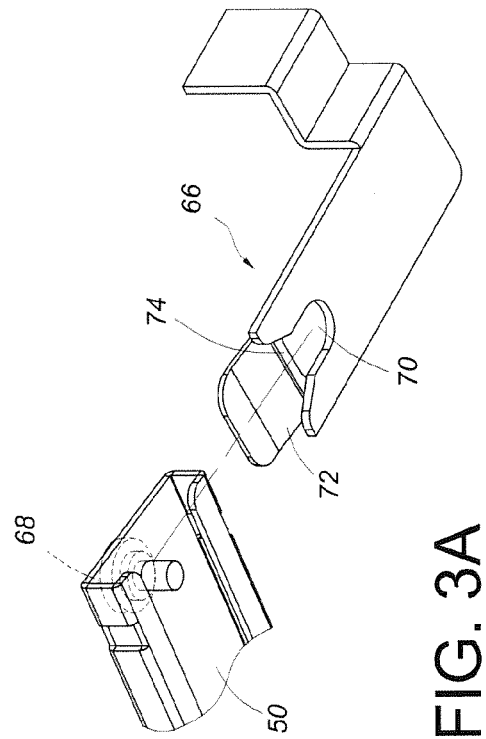
FIG. 3A is an exploded view of the second supporting member and an auxiliary element of the third rail of the first slide rail assembly in FIG. 3.

As shown in FIG. 3 and FIG. 3A, the second supporting member 50 is mounted to the third rail 32 of the first slide rail assembly 22. In a preferred embodiment, the first slide rail assembly 22 further includes an auxiliary element 66 connected with the third rail 32 of the first slide rail assembly 22 (e.g., at a position adjacent to an end portion of the third rail 32) and also includes a positioning element 68 connected with the second supporting member 50.

More specifically, referring to FIG. 3A and FIGS. 4A~4C, the auxiliary element 66 includes a mounting opening 70 and an elastic arm 72. The elastic arm 72 has one end fixed at an appropriate position and has a blocking edge 74 for forming a blockage at the mounting opening 70. The positioning element 68 can be mounted in the mounting opening 70 and be blocked by the blocking edge 74 of the elastic arm 72.

Figure 4A:
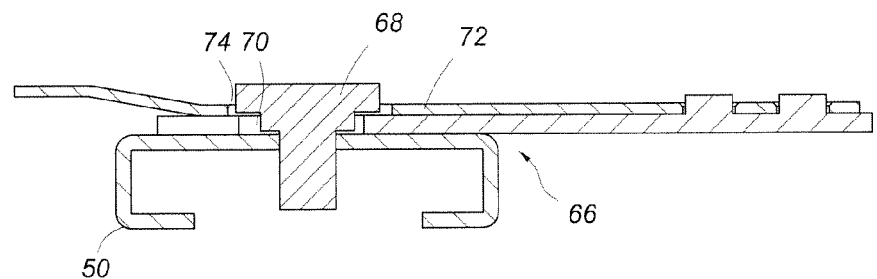
FIG. 4A is a schematic drawing showing how the second supporting member of the cable management arm supporting device in an embodiment of the present invention is mounted to the auxiliary element via a positioning element, which has entered the mounting opening of the auxiliary element and is blocked by the blocking edge.
Figure 4B:
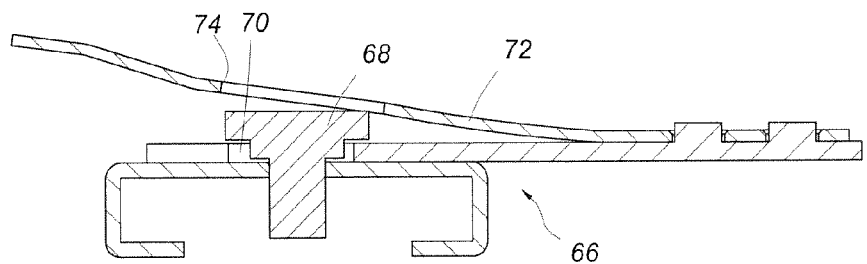
FIG. 4B is another schematic drawing showing how the second supporting member of the cable management arm supporting device in an embodiment of the present invention is mounted to the auxiliary element via the positioning element, in which the free end of the elastic arm of the auxiliary element has been lifted such that the blocking edge no longer forms a blockage at the mounting opening of the auxiliary element.
Figure 4C:
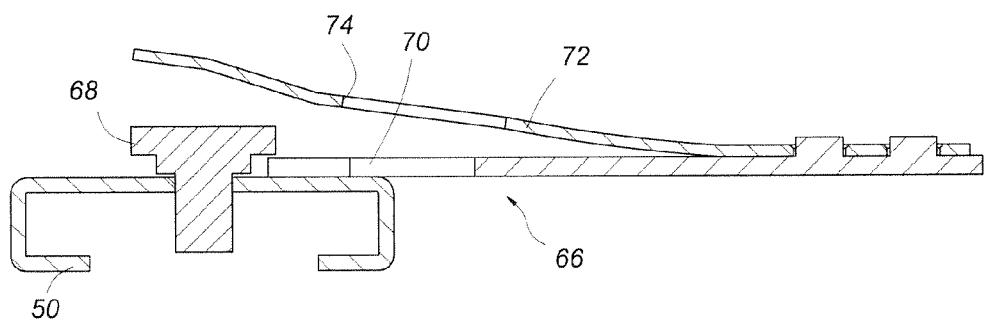
FIG. 4C is yet another schematic drawing showing how the second supporting member of the cable management arm supporting device in an embodiment of the present invention is mounted to the auxiliary element via the positioning element, in which the free end of the elastic arm of the auxiliary element has been lifted, allowing the positioning element to be removed from the mounting opening of the auxiliary element.

For example, once the positioning element 68 connected with the second supporting member 50 enters the mounting opening 70 of the auxiliary element 66, the blocking edge 74 of the elastic arm 72 can block the positioning element 68 such that the positioning element 68 is mounted in the mounting opening 70 of the auxiliary element 66 (see FIG. 4A). Preferably, either of the positioning element 68 and the elastic arm 72 has a guiding feature (e.g., an inclined surface), such that the elastic arm 72 of the auxiliary element 66 can be directly pushed up by the positioning element 68 upon connection between the second supporting member 50 and the auxiliary element 66 and then return to its original position to keep the positioning element 68 in place. In that case, manual operation of the elastic arm 72 will be unnecessary. On the other hand, when it is desired to release the positioning element 68 from the mounted state, the free end of the elastic arm 72 of the auxiliary element 66 can be lifted up to rid the mounting opening 70 of the blockage of the blocking edge 74 of the elastic arm 72 (see FIG. 4B). The positioning element 68 can now be removed from the mounting opening 70 of the auxiliary element 66 (see FIG. 4C), allowing the second supporting member 50 to be rapidly detached from the third rail 32 of the first slide rail assembly 22. According to the above, the second supporting member 50 is configured to be mounted to the third rail 32 of the first slide rail assembly 22 in a releasable manner.

Figure 6:
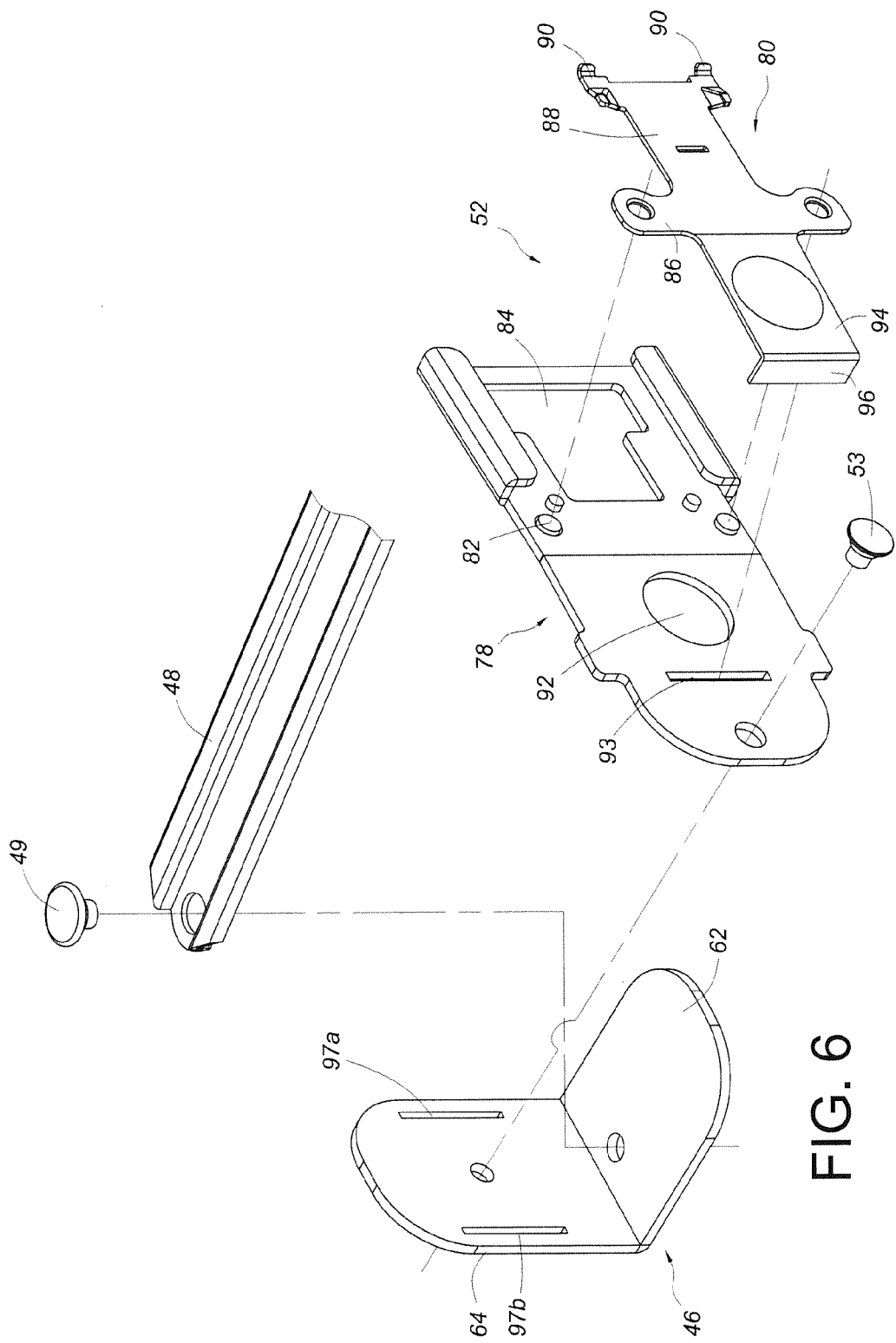
FIG. 6 is a schematic exploded view of the third mounting member, the supporting base, and the first supporting member of the cable management arm supporting device in an embodiment of the present invention.

Referring to FIG. 5 and FIG. 6, the first supporting member 48 is pivotally connected with the first supporting portion 62 of the supporting base 46 via a pivotal connector 49 so as to pivot with respect to the first supporting portion 62 of the supporting base 46. The third mounting member 52 is pivotally connected with the second supporting portion 64 of the supporting base 46 via a pivotal connector 53 so as to pivot with respect to the second supporting portion 64 of the supporting base 46. In addition, the third mounting member 52 is connected with the second slide rail assembly 24 in a releasable manner, as detailed further below.

It is worth mentioning that the supporting base 46 and the third mounting member 52 can be viewed as a mounting assembly applicable to a supporting member (e.g., the first supporting member 48). The mounting assembly enables the supporting member to pivot to different directions via the third mounting member 52 so that the supporting member can be mounted to different objects. For instance, the supporting member can be mounted to the second slide rail assembly 24 via the third mounting member 52, or the supporting member can be mounted to the first slide rail assembly 22 via the third mounting member 52 (see FIG. 12).

In a preferred embodiment, the second slide rail assembly 24 further includes a connector 76 connected with the first rail 28 of the second slide rail assembly 24, and the third mounting member 52 further includes a mounting wall 78 and an operation arm 80 corresponding to and connected with the mounting wall 78. The mounting wall 78 includes at least one fixing portion 82 and a first opening 84. The operation arm 80 includes a connecting portion 86 corresponding to and fixedly connected with the at least one fixing portion 82. The operation arm 80 also includes a first elastic portion 88 connected with one side of the connecting portion 86 and corresponding to the first opening 84.

The first elastic portion 88 includes at least one engaging portion 90 for blocking an object. For example, when the third mounting member 52 is connected with the connector 76 of the second slide rail assembly 24, the at least one engaging portion 90 corresponds to and blocks a portion of the connector 76 to keep the third mounting member 52 and the connector 76 in a mounted state. An operator can operate (e.g., press) the first elastic portion 88 through the first opening 84 to displace the at least one engaging portion 90 with respect to the portion of the connector 76, thus releasing the third mounting member 52 and the connector 76 from the mounted state, allowing the third mounting member 52 to be detached from the connector 76.

Preferably, the mounting wall 78 of the third mounting member 52 further includes a second opening 92 and a through hole 93, and the operation arm 80 further includes a second elastic portion 94 connected with another side of the connecting portion 86 (for example, but without limitation, the second elastic portion 94 and the first elastic portion 88 are located on two opposite sides of the connecting portion 86 respectively and use the connecting portion 86 as a common fulcrum) and corresponding to the second opening 92. In addition, an engaging section 96 is connected with the second elastic portion 94. The engaging section 96 corresponds to and can pass through the through hole 93 of the mounting wall 78. On the other hand, the second supporting portion 64 of the supporting base 46 further includes a first positioning portion 97a and a second positioning portion 97b. The engaging section 96 can engage with the first positioning portion 97a or the second positioning portion 97b after passing through the through hole 93 of the mounting wall 78.

Figure 7:
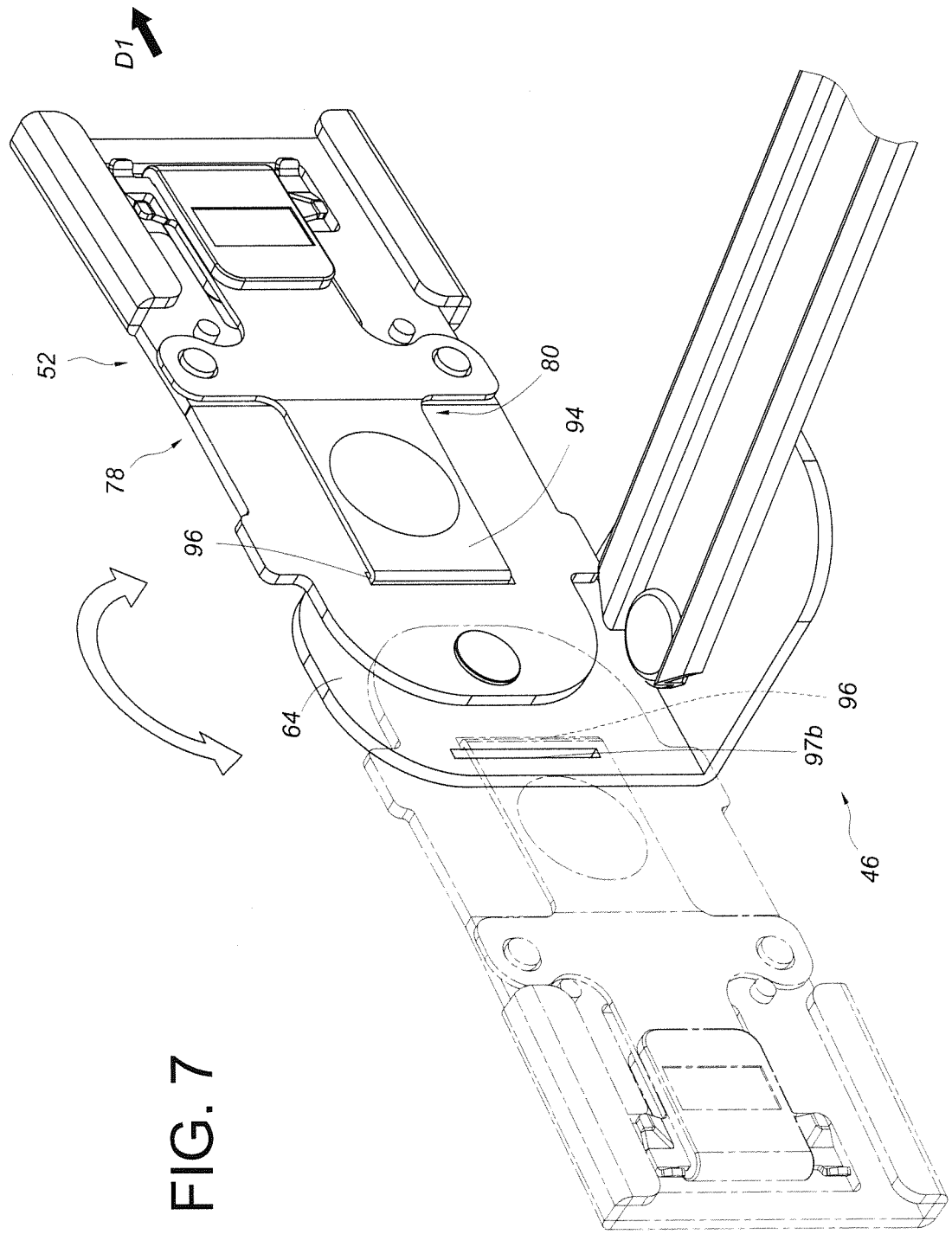
FIG. 7 schematically shows how the third mounting member of the cable management arm supporting device in an embodiment of the present invention can be operated to point to a first direction or a second direction.

More specifically, referring to FIG. 7, the third mounting member 52, which is pivotally connected with the second supporting portion 64 of the supporting base 46, can be pivoted to a first direction D1 or a second direction D2. Preferably, the first direction D1 and the second direction D2 are opposite directions. The third mounting member 52, therefore, can be mounted to the connector 76 of the second slide rail assembly 24 when pivoted to the first direction D1 and can be mounted to a connector of the first slide rail assembly 22 when pivoted to the second direction D2 (as explained further below with reference to FIGS. 9~12).

Figure 8A:
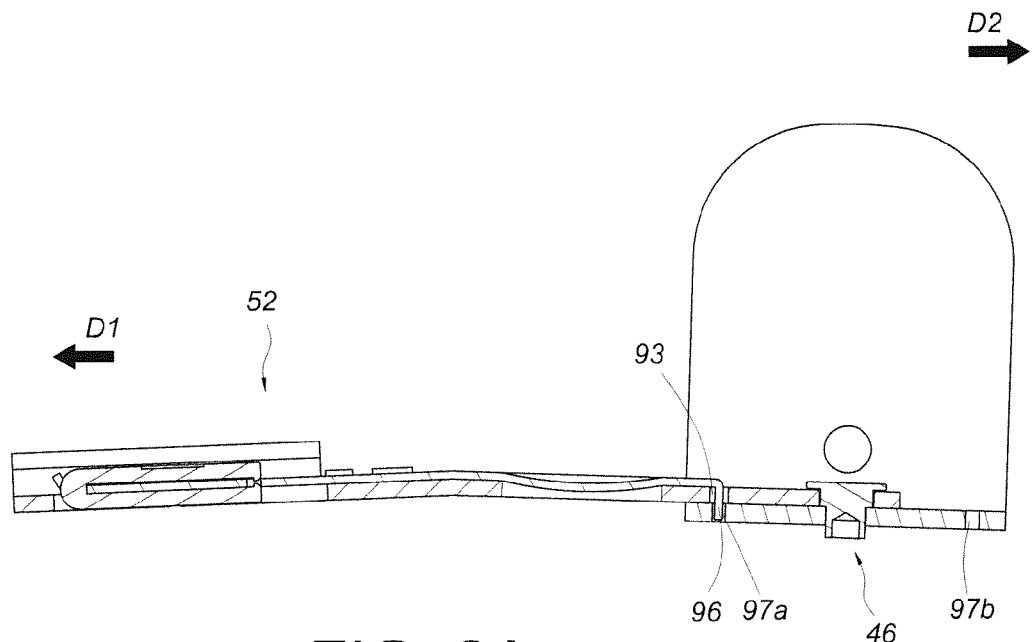
FIG. 8A schematically shows how the engaging section of the third mounting member of the cable management arm supporting device in an embodiment of the present invention is engaged with the first positioning portion of the supporting base.
Figure 8B:
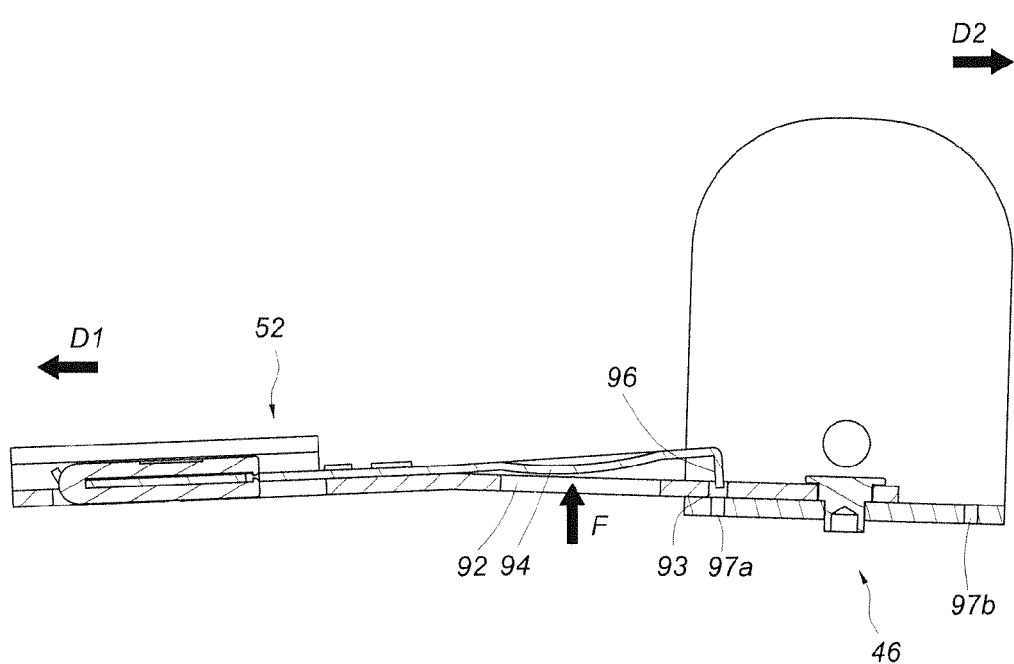
FIG. 8B schematically shows how the third mounting member of the cable management arm supporting device in an embodiment of the present invention is operated to disengage the engaging section from the first positioning portion.

Referring to FIGS. 8A~8B in conjunction with FIG. 7, once the third mounting member 52 is pivoted to the first direction D1, the engaging section 96 sequentially passes through the through hole 93 of the mounting wall 78 and the first positioning portion 97a of the supporting base 46 and becomes engaged with the first positioning portion 97a to limit and fix the third mounting member 52 in position. Thus, the stability of the third mounting member 52 is increased, which is advantageous to the mounting process.

When it is desired to pivot the third mounting member 52 from the first direction D1 to the second direction D2, the operator can apply a force F to (i.e., press) the second elastic portion 94 of the operation arm 80 through the second opening 92 to disengage the engaging section 96 from the through hole 93 and the first positioning portion 97a of the supporting base 46. Then, the third mounting member 52 can be pivoted from the first direction D1 to the second direction D2, allowing the engaging section 96 to engage with the second positioning portion 97b of the supporting base 46 and thereby limit and fix the third mounting member 52 in position. Consequently, the stability of the third mounting member 52 is increased, which facilitates mounting. It can be known from the above that the engaging section 96 can selectively engage with either of the first positioning portion 97a and the second positioning portion 97b.

Figure 9:
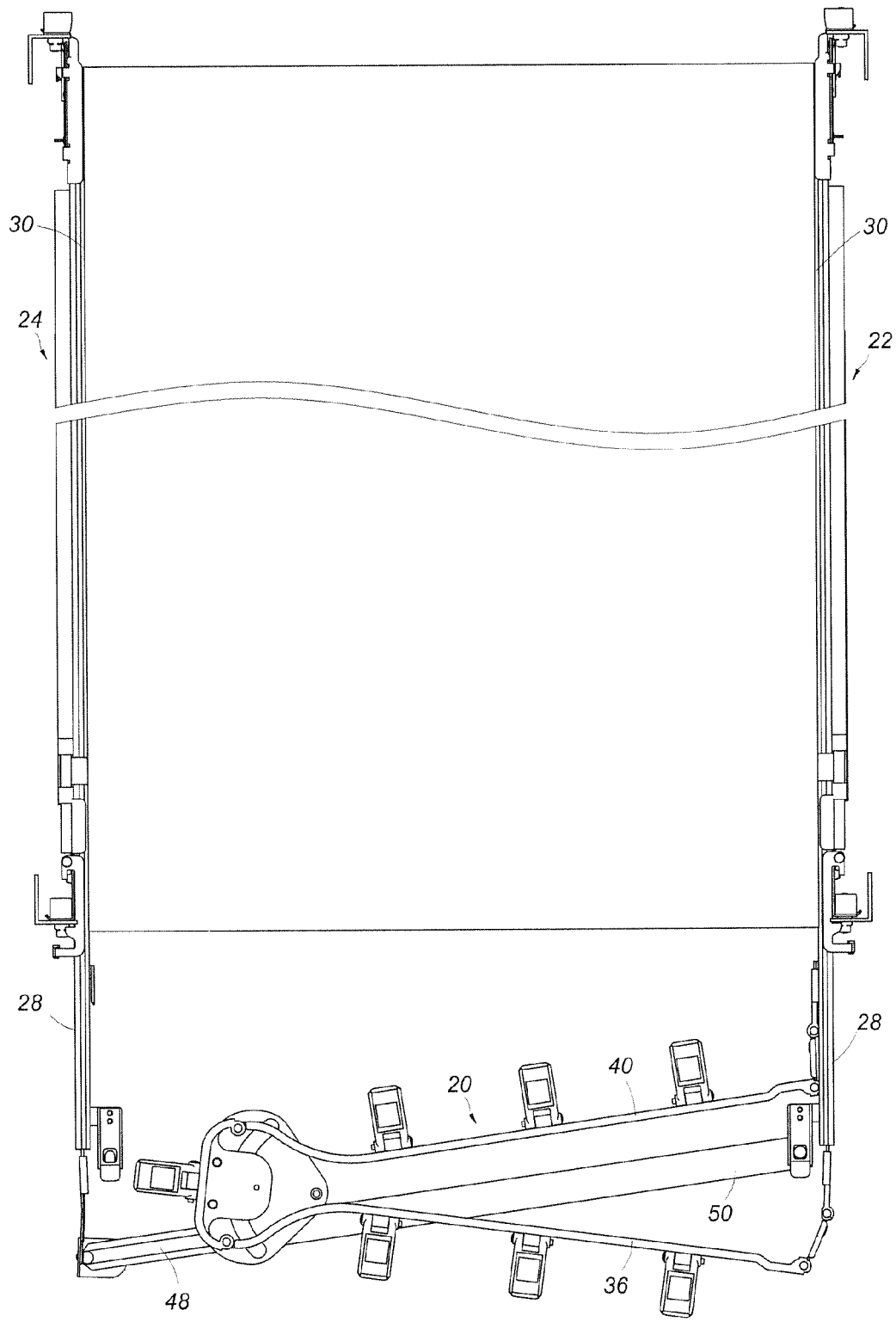
FIG. 9 is a schematic drawing in which the second arm of the cable management arm supporting device in an embodiment of the present invention is close to the first arm and the second supporting member is retracted with respect to the first supporting member.

Referring to FIG. 9, when the second rail 30 of the first slide rail assembly 22 and the second rail 30 of the second slide rail assembly 24 are in a retracted position relative to their respective first rails 28, the second arm 40 is close to the first arm 36, and the second supporting member 50 is retracted relative to the first supporting member 48.

Figure 10:
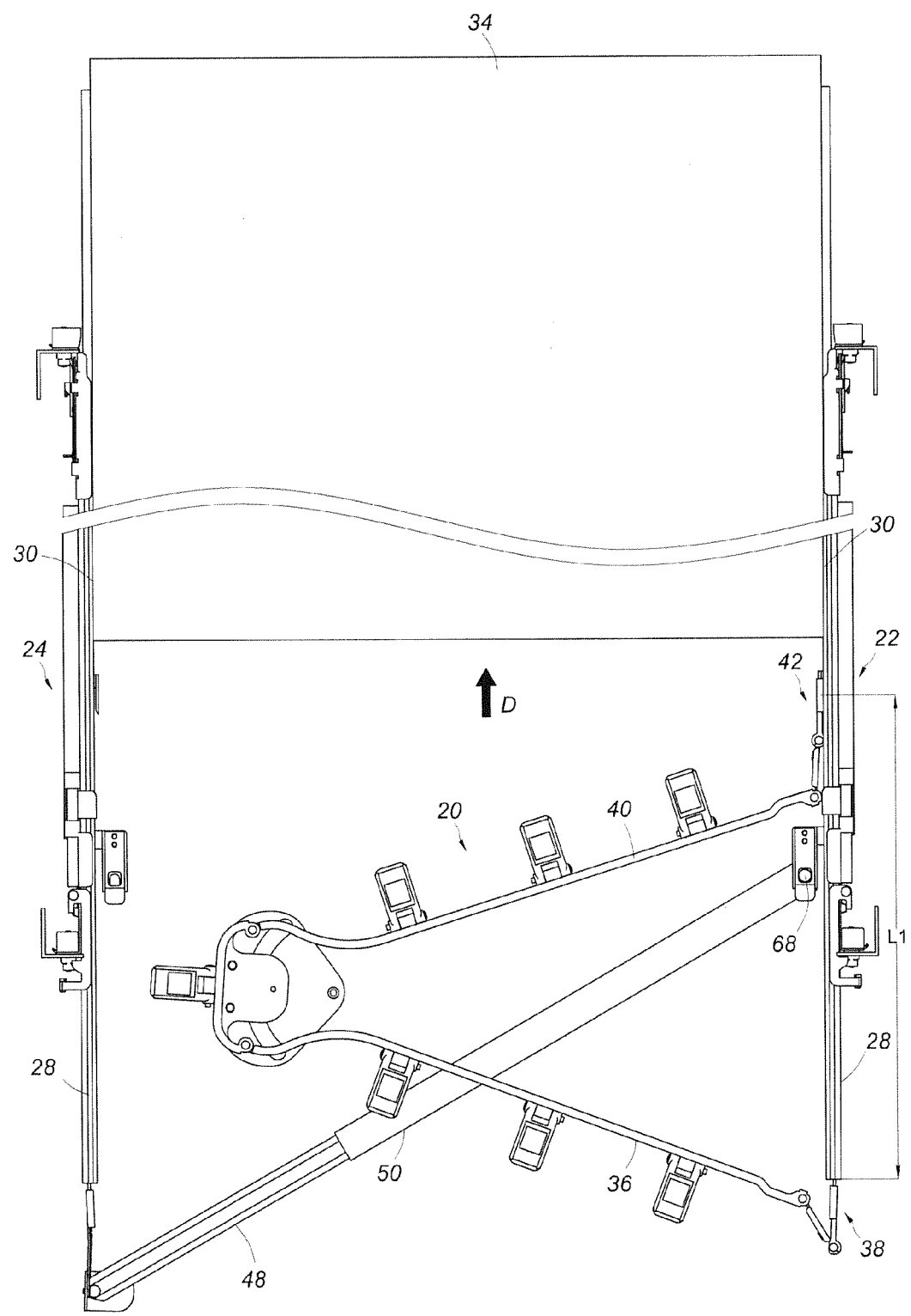
FIG. 10 is a schematic drawing in which the second mounting member of the cable management arm supporting device in an embodiment of the present invention has been displaced a certain distance from the first mounting member, causing the second arm to extend relative to the first arm, and the second supporting member to displace relative to the first supporting member.

Referring to FIG. 10, when the second rail 30 of the first slide rail assembly 22 and the second rail 30 of the second slide rail assembly 24 are longitudinally displaced a distance L1 in a direction D from the retracted position toward an extended position relative to their respective first rails 28, the chassis 34 is also displaced in the direction D. Meanwhile, the second mounting member 42 of the cable management arm supporting device 20 is displaced relative to the first mounting member 38 in the direction D, and the second arm 40 is extended relative to the first arm 36. Since the third rail 32 (see FIG. 2) of the first slide rail assembly 22 is also driven to displace longitudinally in the direction D by the second rail 30 of the first slide rail assembly 22, the second supporting member 50, which is connected with the third rail 32 of the first slide rail assembly 22 via the positioning element 68, is displaced relative to the first supporting member 48 in response to extension of the second arm 40 relative to the first arm 36.

Figure 11:
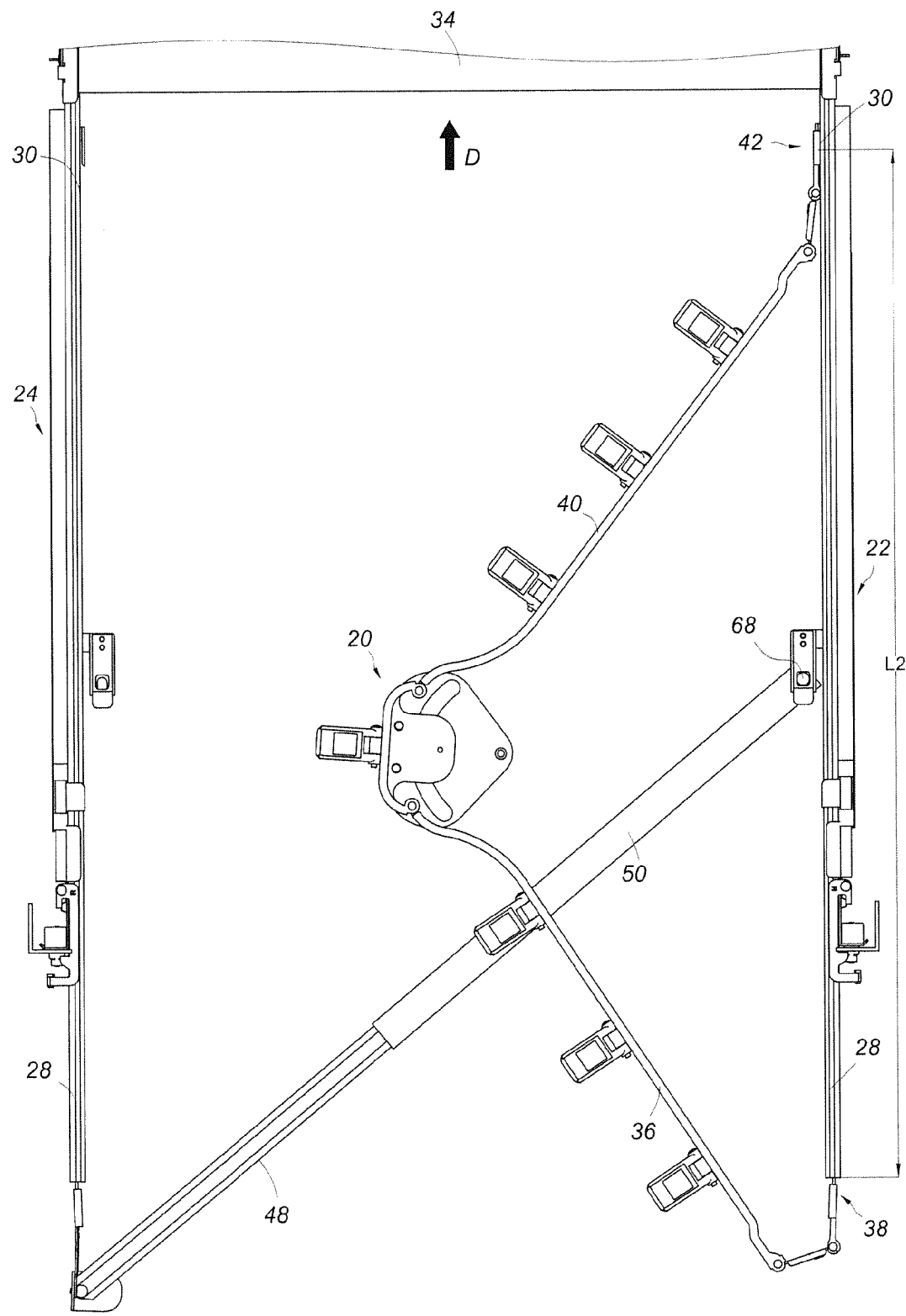
FIG. 11 is a schematic drawing in which the second mounting member of the cable management arm supporting device in an embodiment of the present invention has been displaced further from the first mounting member, causing the second arm to extend further relative to the first ann, and the second supporting member to displace further relative to the first supporting member.

Referring to FIG. 11, when the second rail 30 of the first slide rail assembly 22 and the second rail 30 of the second slide rail assembly 24 are longitudinally displaced further in the direction D so as to be a distance L2 from the retracted position relative to their respective first rails 28, the chassis 34 is also displaced in the direction D. In the meantime, the second mounting member 42 of the cable management arm supporting device 20 is further displaced relative to the first mounting member 38 in the direction D, and the second arm 40 is further extended relative to the first arm 36. Since the third rail 32 of the first slide rail assembly 22 is also driven by the second rail 30 of the first slide rail assembly 22 to displace longitudinally further in the direction D, the second supporting member 50, which is connected with the third rail 32 of the first slide rail assembly 22 via the positioning element 68, is further displaced relative to the first supporting member 48 in response to further extension of the second arm 40 relative to the first arm 36.

It can be known from FIGS. 9~11 that the second arm 40 is extended (or folded) relative to the first arm 36 in response to displacement of the second rail 30 of the first slide rail assembly 22, and that the second supporting member 50 is displaced relative to the first supporting member 48 in response to displacement of the third rail 32 of the first slide rail assembly 22. Therefore, in the course in which the chassis 34 is pulled out or pushed back in place, the first arm 36 and the second arm 40 jointly provide cable management (e.g., to keep the cables behind the server chassis 34 in neat arrangement) while the first supporting member 48 and the second supporting member 50 cooperate in providing support (e.g., to support the first arm 36).

Figure 12:
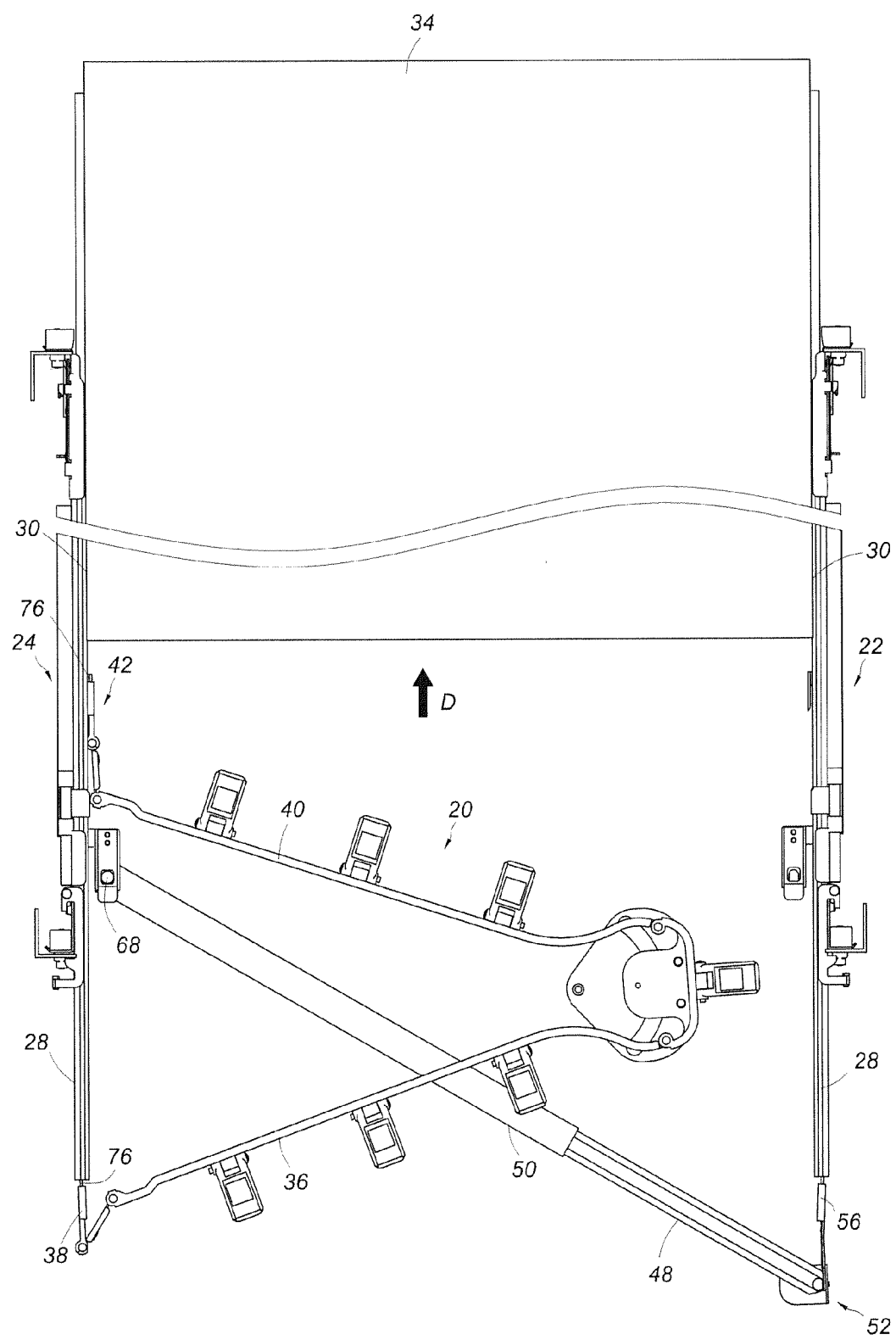
FIG. 12 is a schematic drawing in which the third mounting member of the cable management arm supporting device in another embodiment of the present invention is mounted to the first connector of the first slide rail assembly.

FIG. 12 shows how the cable management arm supporting device 20 in another embodiment of the present invention is applied to and works with the first slide rail assembly 22 and the second slide rail assembly 24.

When the third mounting member 52 is pivoted to the second direction D2 (see FIG. 7), it can be mounted in a different way from that illustrated in the foregoing embodiment (as shown in FIGS. 9~11), or more particularly be mounted to the first connector 56 on the first rail 28 of the first slide rail assembly 22. Meanwhile, the first mounting member 38 and the second mounting member 42, which are respectively pivotally connected with the first arm 36 and the second arm 40, can also be pivoted to the second direction D2 in order to be mounted to the connector 76 and another connector 76 of the second slide rail assembly 24 respectively. The connecters 76 are connected with the first rail 28 and the second rail 30 of the second slide rail assembly 24, respectively. In use, therefore, the arrangement of the cable management arm supporting device 20 with respect to the first slide rail assembly 22 and the second slide rail assembly 24 can be inverted to suit practical needs.

Figure 13:
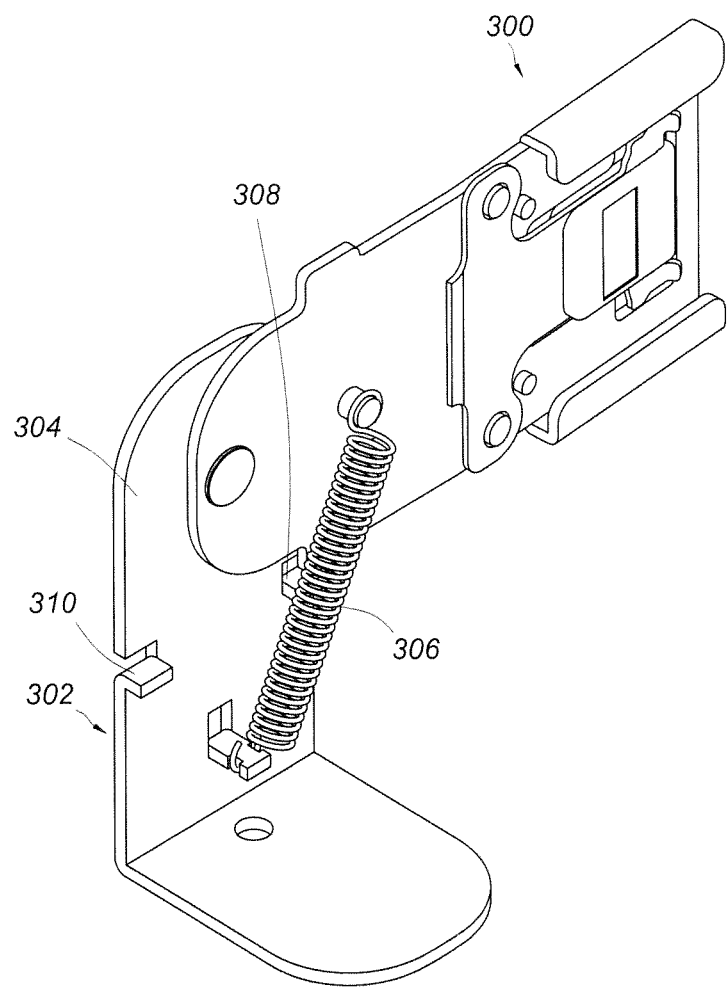
FIG. 13 is a perspective view showing in particular the elastic element connected between the third mounting member and the second supporting portion of the supporting base of the cable management arm supporting device in the second embodiment of the present invention.

FIG. 13 shows how the third mounting member 300 of the cable management arm supporting device in the second embodiment of the present invention is arranged in relation to the supporting base 302. As in the previous embodiment, the third mounting member 300 is pivotally connected with the second supporting portion 304 of the supporting base 302. However, the second embodiment is different from the first embodiment (see FIG. 7) in that the cable management arm supporting device further includes an elastic element 306 connected between the third mounting member 300 and the second supporting portion 304 of the supporting base 302, and that the second supporting portion 304 of the supporting base 302 further includes a first stop portion 308 and a second stop portion 310.

Figure 14:
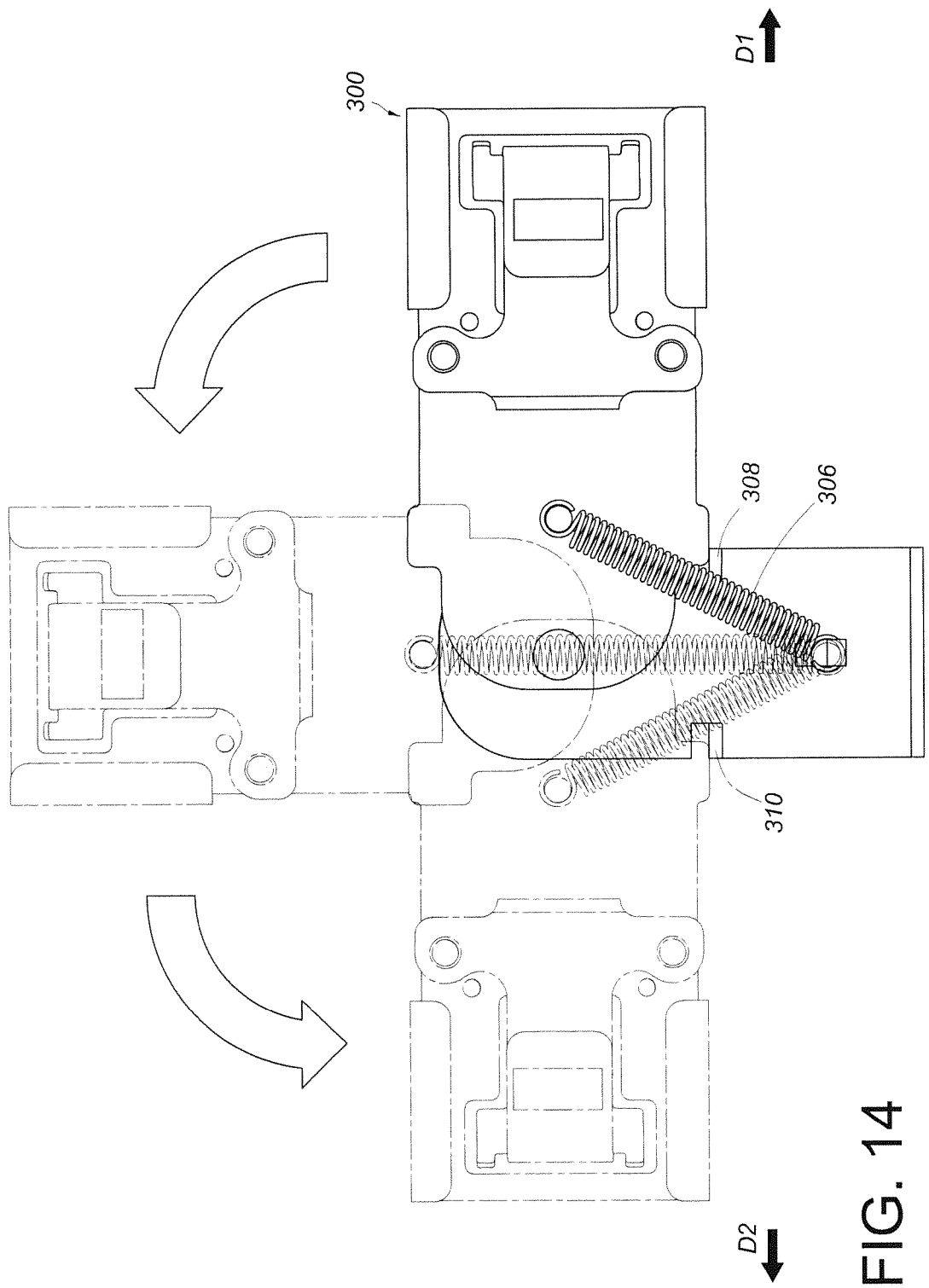
FIG. 14 schematically shows how the third mounting member of the cable management arm supporting device in the second embodiment of the present invention can be limited in position by the stop portions of the second supporting portion of the supporting base when pivoting.

As shown in FIG. 14, when the third mounting member 300 is pivoted to a first direction D1, it is pressed against the first stop portion 308 due to the elastic element 306 and is thus limited in position. Once the third mounting member 300 is pivoted from the first direction D1 to a second direction D2 opposite the first direction D1, it is pressed against the second stop portion 310 due to the elastic element 306 and hence limited in position.

While the present invention has been disclosed through the foregoing preferred embodiments, it is understood that the embodiments are not intended to be restrictive of the present invention. The scope of patent protection sought is defined by the appended claims.

The invention claimed is:

1. A cable management arm supporting device, to be mounted to a first slide rail assembly and a second slide rail assembly, wherein the first slide rail assembly includes a first rail, a second rail, and a third rail movably connected between the first rail and the second rail, the cable management arm supporting device comprising:
   a first arm having a first end and a second end;
   a first mounting member connected to the first arm at a position adjacent to the first end, the first mounting member being mounted to the first rail of the first slide rail assembly;
   a second arm movably connected to the first arm at a position adjacent to the second end;
   a second mounting member connected with the second arm, the second mounting member being mounted to the second rail of the first slide rail assembly;
   a plurality of cable supporting features connected with at least one of the first arm and the second arm;
   a supporting base having a first supporting portion and a second supporting portion generally perpendicularly connected with the first supporting portion;
   a first supporting member and a second supporting member, wherein the first supporting member is movably connected with the first supporting portion of the supporting base, and the second supporting member is telescopically connected with the first supporting member and mounted to the third rail of the first slide rail assembly; and
   a third mounting member pivotally connected with the second supporting portion of the supporting base, the third mounting member being releasably connected with the second slide rail assembly.

2. The cable management arm supporting device of claim 1, wherein the first slide rail assembly further includes a first connector connected with the first rail, and the first mounting member is releasably mounted to the first connector.

3. The cable management arm supporting device of claim 1, wherein the first slide rail assembly further includes a second connector connected with the second rail, and the second mounting member is releasably mounted to the second connector.

4. The cable management arm supporting device of claim 1, wherein the second slide rail assembly further includes a connector, the third mounting member further includes a mounting wall and an operation arm connected with the mounting wall, the mounting wall includes at least one fixing portion and a first opening, the operation arm includes a connecting portion connected with the at least one fixing portion and includes a first elastic portion connected with one side of the connecting portion and corresponding to the first opening, and the first elastic portion includes at least one engaging portion for blocking the connector.

5. The cable management arm supporting device of claim 4, wherein the mounting wall of the third mounting member further includes a second opening, the operation arm further includes a second elastic portion connected with an other side of the connecting portion and corresponding to the second opening and also includes an engaging section connected with the second elastic portion, the second supporting portion of the supporting base further includes a first positioning portion and a second positioning portion, and the engaging section is selectively engageable with one of the first positioning portion and the second positioning portion.

6. The cable management arm supporting device of claim 1, further including an elastic element connected between the third mounting member and the second supporting portion of the supporting base, the second supporting portion of the supporting base further including a first stop portion and a second stop portion, wherein the third mounting member is pressed against the first stop portion due to the elastic element when pivoted to a first direction and is pressed against the second stop portion due to the elastic element when pivoted to a second direction opposite the first direction.

7. The cable management arm supporting device of claim 1, further including an auxiliary element connected with the third rail of the first slide rail assembly and a positioning element connected with the second supporting member, wherein the auxiliary element includes a mounting opening and an elastic arm, the elastic arm has a blocking edge for forming a blockage at the mounting opening, and the positioning element is mounted in the mounting opening and can be blocked by the blocking edge of the elastic arm.

8. The cable management arm supporting device of claim 1, further including a hinge member by which the first arm and the second arm are pivotally connected.

9. The cable management arm supporting device of claim 1, wherein the first mounting member is pivotally connected with the first end of the first arm.

10. The cable management arm supporting device of claim 1, wherein the second mounting member is pivotally connected with the second arm.

11. The cable management arm supporting device of claim 1, wherein the first supporting member is pivotally connected with the first supporting portion of the supporting base.

\* \* \* \* \*